United States Patent [19]

Burroughs

[11] Patent Number: 4,529,966

[45] Date of Patent: Jul. 16, 1985

[54] HIGH-SPEED BIPOLAR LOGARITHMIC ANALOG-TO-DIGITAL CONVERTER

[75] Inventor: James A. Burroughs, Austin, Tex.

[73] Assignee: The United States of America as represented by the Secretary of the Navy, Washington, D.C.

[21] Appl. No.: 540,971

[22] Filed: Oct. 11, 1983

[51] Int. Cl.³ .............................................. H03K 13/02
[52] U.S. Cl. ......................... 340/347 CC; 340/347 AD
[58] Field of Search ................... 340/347 AD, 347 CC

[56] References Cited

U.S. PATENT DOCUMENTS

| | | | |
|---|---|---|---|
| 3,653,033 | 3/1972 | Bonami et al. | 340/347 DA |
| 3,811,125 | 5/1974 | Schumann | 340/347 CC |
| 3,940,760 | 2/1976 | Brokaw | 340/347 DA |
| 4,005,410 | 1/1977 | Michael et al. | 340/347 CC |
| 4,156,233 | 5/1979 | Puckette | 340/347 CC X |
| 4,168,492 | 9/1979 | Uya | 340/347 CC X |
| 4,275,386 | 6/1981 | Michel et al. | 340/347 AD |
| 4,490,713 | 12/1984 | Mrozowski et al. | 340/347 CC |

Primary Examiner—B. Dobeck
Attorney, Agent, or Firm—R. F. Beers; H. A. David

[57] ABSTRACT

A high-speed bipolar logarithmic analog-to-digital (A/D) converter outputs a signed binary number proportional to the logarithm of a bipolar analog input signal. A log converter is followed by a level shifting amplifier to center the output of the log converter on a temperature compensating reference. The reference voltage from the temperature compensating reference is used by a linear A/D converter to set the end points of the converter range. A code converter follows the A/D converter if a uniform absolute value coding is desired. Limiting the number of least significant bits (LSB) used to those representing the range of usable converter operation completes the device.

6 Claims, 3 Drawing Figures

HIGH-SPEED BIPOLAR LOGARITHMIC ANALOG-TO-DIGITAL CONVERTER

BACKGROUND OF THE INVENTION

1. Field of the Invention

The present invention relates to data processing electrical circuits, and more particularly to a high-speed bipolar logarithmic analog-to-digital (A/D) converter to provide a signed binary number output proportional to the logarithm of a bipolar analog input signal.

2. Description of the Prior Art

Prior art circuits are illustrated in FIGS. 1(a) and 1(b) which illustrate one method for providing a true logarithmic output suitable for arithmetic use. Generally, a current-to-voltage transducer with a mathematically true logarithmic response is used, usually the base-emitter junction of a transistor, within the limited range of its "ideal" behavior. In FIG. 1(a) a direct current offset is used to accomodate a bipolar input with a single logging transistor converter. The frequency response of this circuit is unsymmetrical since the amplifier responds more slowly at the lower circuit (positive) input. The circuit also places high requirements on the components for a given accuracy level because of the wide response required of the logging transistor and the use of multiple reference currents and voltages. It also is difficult to accurately compensate for temperature variations in the circuit gain. Alternatively, the more complex circuit of FIG. 1(b) inserted at Z in FIG. 1(a) overcomes some of these limitations, but the multiple operational amplifiers make it slow to respond. It also is difficult to compensate for gain variations with temperature.

Another method involves piecewise linear approximation of a hyperbolic sine function by a large resistor network. This method requires large scale integrated circuit technology for implementation. It is suitable for digitally encoding and decoding low speed communications signals, but it is not suitable for arithmetic operations.

SUMMARY OF THE INVENTION

Accordingly, the present invention provides a high-speed bipolar logarithmic analog-to-digital (A/D) converter which outputs a signed binary number proportional to the logarithm of a bipolar analog input signal. A log converter is followed by a level shifting amplifier to center the output of the log converter on a temperature compensating reference. The reference voltage from the temperature compensating reference is used by a linear A/D converter to set the end points of the converter range. A code converter follows the A/D converter if a uniform absolute value coding is desired. Limiting the number of least significant bits (LSB) used to those representing the range of usable converter operation completes the device.

Therefore, it is an object of the present invention to provide a bipolar logarithmic A/D converter which is optimized for high-speed operation.

Another object of the present invention is to provide a bipolar logarithmic A/D converter which has ideal gain compensation with temperature variations.

Other objects, advantages and novel features will be apparent from the following detailed description when read in conjunction with the appended claims and attached drawing.

DESCRIPTION OF THE PREFERRED EMBODIMENT

Figure 1A:
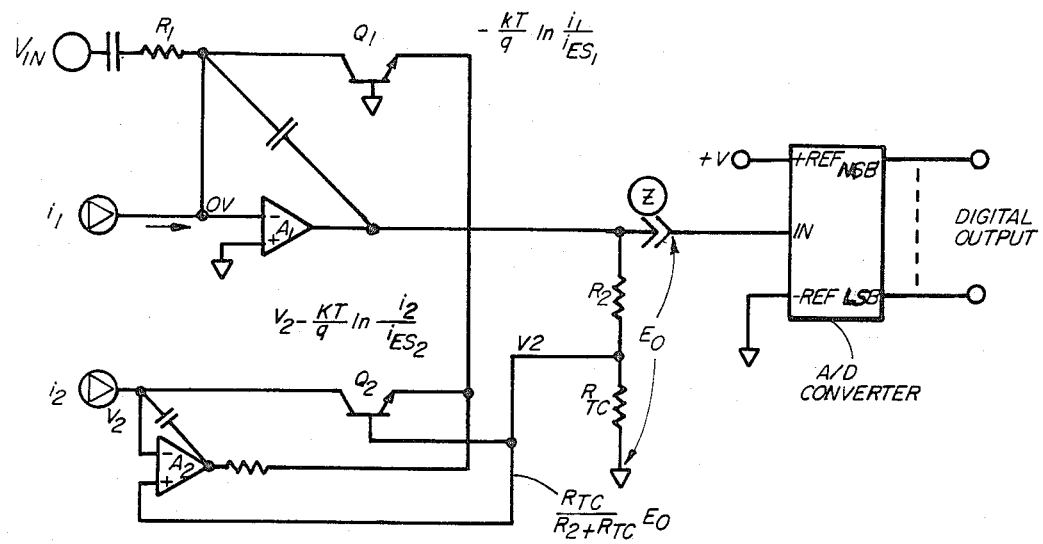
FIG. 1(a) is a schematic diagram of a prior art logarithmic analog-to-digital converter.
Figure 1B:
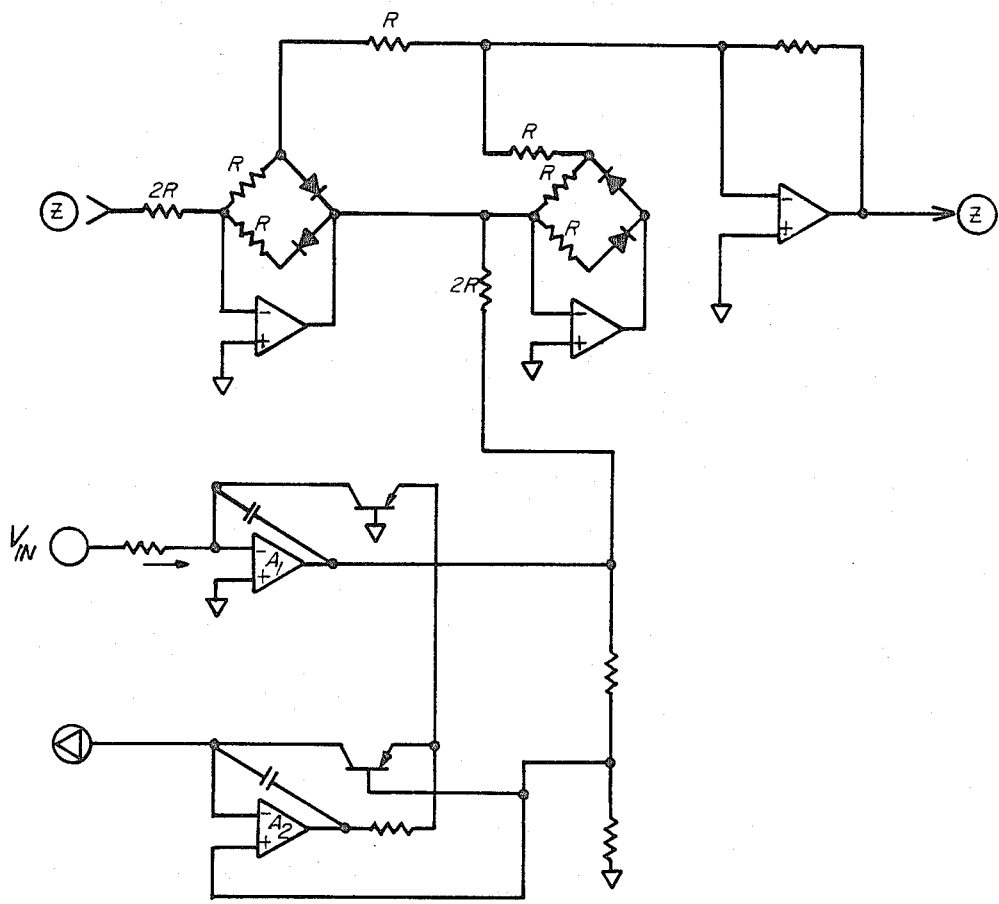
FIG. 1(b) is a schematic diagram of a more complex prior art logarithmic analog-to-digital converter.
Figure 2:
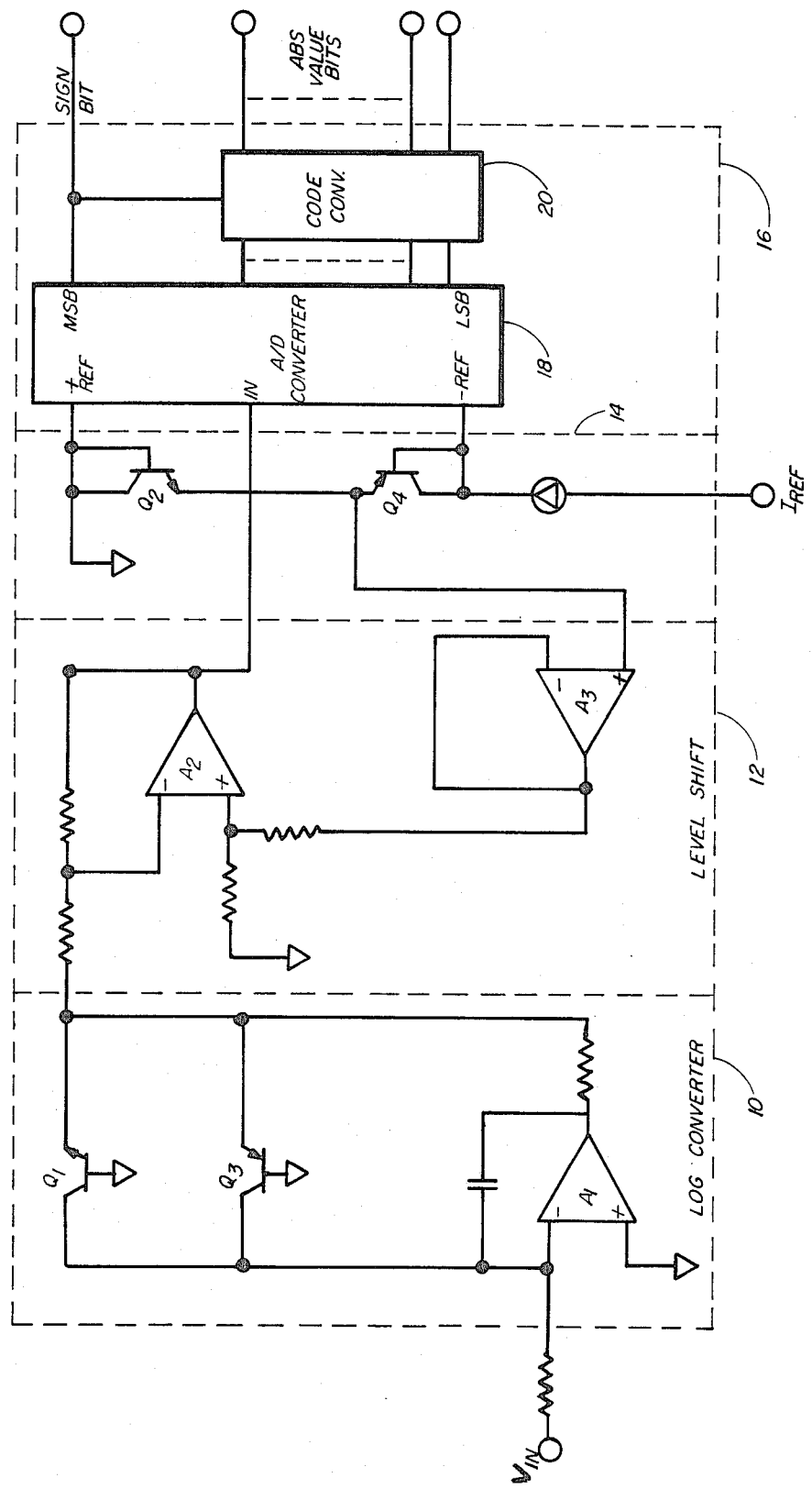
FIG. 2 is a schematic diagram of a high-speed bipolar logarithmic analog-to-digital converter according to the present invention.

Referring now to FIG. 2 there are three basic sections to a high-speed bipolar logarithmic analog-to-digital (A/D) converter. The first section 10 is a log converter which may be any logarithmic response transducer, such as different polarity transistors $Q_1$ and $Q_3$ connected in the common base mode, suitable for two polarity operation connected in a standard operational amplifier A feedback loop to force the output to a level in logarithmic conformity to the input driving current.

The second section 12 is a level shifting amplifier having operational amplifiers $A_2$ and $A_3$ which are designed to "center" the output of the log converter 10 on a temperature compensating reference 14 formed by transistors $Q_2$ and $Q_4$. Transistor $Q_2$ is matched to logging transistor $Q_1$ and transistor $Q_4$ is matched to logging transistor $Q_3$. The degree of match with temperature variation depends on close thermal coupling between the four transistors. Transistors $Q_2$ and $Q_4$ are converted to a temperature compensating voltage reference by passing a maximum usable reference current $I_{REF}$ through them. $I_{REF}$ is the maximum current that the transistors will tolerate while maintaining a linear, logarithmic characteristic.

Use of the temperature compensating voltage reference with a standard linear A/D converter 18 and a code converter 20 forms the third section 16. The A/D converter 18 may be of any type or resolution provided that it uses an external reference. The end points of the converter range are set by the external reference which is determined by the voltages developed across transistors $Q_2$, $Q_4$ by the reference current $I_{REF}$. To make use of the available dynamic range of the logging transistors $Q_1$, $Q_3$ the reference current $I_{REF}$ is chosen at the maximum value of current which will provide adequate log conformity. In this configuration the A/D converter 18 provides a digital output which is referenced to the reference current $I_{REF}$ as the 0 dB point. An input of $+I_{REF}$ provides a digital output of all "ones", and an input of $-I_{REF}$ provides an output of all "zeros". A code converter 20 follows the A/D converter 18 if a uniform absolute value coding is desired. The code converter 20 provides for inversion of the number of used least significant bits when the most significant bit is "one". Limiting the number of least significant bits used to those representing the range of usable converter operation completes the device.

Thus, the present invention is a high-speed bipolar logarithmic A/D converter which compensates for temperature variations and uses a simple maximum usable reference current allowing the converter to count down in dB to obtain the desired measurement as opposed to counting up in dB from a zero or other arbitrary low reference voltage as in prior art devices.

What is claimed is:

1. A bipolar logarithmic analog-to-digital converter comprising;

a log converter having an output level in logarithmic conformity to an input driving current;

a temperature compensating reference circuit having a maximum, usable reference current input;

means for converting said output level from said log converter to a digital signal, said converting means using an external reference and said external reference being derived from said temperature compensating reference circuit; and a level shifting amplifier following said log converter to center said log converter output level on a temperature compensating voltage reference derived from said temperature compensating reference circuit.

2. An analog-to-digital converter as recited in claim 1 further comprising a code converter following said converting means for inversion of the number of used least significant bits when the most significant bit from said converting means is one.

3. An analog-to-digital converter as recited in claim 1 wherein said log converter comprises:

an operational amplifier; and a logarithmic response transducer suitable for two polarity operation connected in the feedback loop of said operational amplifier.

4. An analog-to-digital converter as recited in claim 3 wherein said logarithmic response transducer comprises a pair of complementary logging transistors connected in the common base mode.

5. An analog-to-digital converter as recited in claim 4 wherein said temperature compensating reference circuit comprises a pair of complementary reference transistors connected in a common emitter mode with said emitter providing said temperature compensating voltage reference and the respective collector-base outputs providing said external reference, said complementary reference transistors being matched to said complementary logging transistors.

6. An analog-to-digital converter as recited in claim 5, wherein said level shifting amplifier comprises:

a first operational amplifier connected between said log converter and said converting means to pass said output level to said converting means; and a second operational amplifier connected between said temperature compensating reference circuit and said first operational amplifier to center said output level on said temperature compensating voltage reference.

* * * * *